United States Patent [19]
Kleine

[11] Patent Number: 6,162,682
[45] Date of Patent: Dec. 19, 2000

[54] STRUCTURE AND PROCESS FOR A GOUGE-FREE STACKED NON-VOLATILE MEMORY CELL WITH SELECT GATE

[75] Inventor: John Stuart Kleine, Santa Clara, Calif.

[73] Assignee: Cypress Semiconductor Corporation, San Jose, Calif.

[21] Appl. No.: 09/010,893

[22] Filed: Jan. 22, 1998

Related U.S. Application Data

[62] Division of application No. 08/537,131, Sep. 29, 1995.

[51] Int. Cl.$^7$ .................................................. H01L 21/336
[52] U.S. Cl. ............................................ 438/257; 438/258
[58] Field of Search ................................... 438/257, 258, 438/588, 241, 305

[56] References Cited

U.S. PATENT DOCUMENTS

| | | | |
|---|---|---|---|
| 5,057,448 | 10/1991 | Kuroda | 438/258 |
| 5,188,976 | 2/1993 | Kume et al. | 438/258 |
| 5,223,451 | 6/1993 | Uemura et al. | 437/154 |
| 5,326,999 | 7/1994 | Kim et al. | 275/315 |
| 5,340,760 | 8/1994 | Komori et al. | 438/258 |
| 5,439,838 | 8/1995 | Yang | 437/43 |
| 5,596,529 | 1/1997 | Noda et al. | 365/185 |
| 5,677,215 | 10/1997 | Goo | 437/43 |
| 5,847,427 | 12/1998 | Hagiwara | 438/257 |
| 5,902,121 | 5/1999 | Goto | 438/258 |

OTHER PUBLICATIONS

M. Momodomi et al., "New Device Technologies For 5V–Only 4Mb EEPROM With Nand Structure Cell", *EIDM Tech. Dig.*, pp. 412–415 (1988).

A. Barcella et al., "A 70ns CMOS Double Metal 16Mbit EPROM With Hierarchical Word Line Decoder", *IEEE Nonvolatile Semiconductor Memory Workshop*, pp. 5.6–5.7 (Aug. 14, 1995).

*Primary Examiner*—John F. Niebling
*Assistant Examiner*—Walter L. Lindsay, Jr.
*Attorney, Agent, or Firm*—Brinks Hofer Gilson & Lione

[57] ABSTRACT

A structure and process for a gouge-free substrate non-volatile memory cell with a floating gate, field effect transistor and a select gate transistor. The cell includes a floating gate, field effect transistor and a select gate transistor wherein the select gate transistor comprises a first conductive layer covered by a second conductive layer wherein electrical contact is made to the first conductive layer. The invention contemplates that the first and second conductive layers can be separated by an insulative layer. The invention also contemplates that the first and second conductive layers may be of different cross-sectional areas, wherein the cross-sectional area of the first conductive layer is larger than the cross-sectional area of the second conductive layer and wherein electrical contact is made to the first conductive layer at a sight not encompassed or covered by the second conductive layer. Also presented is a process of construction of peripheral die circuits comprised of two conductive layers similar to the select gate of the non-volatile memory cell or comprised of second conductive layer material.

12 Claims, 9 Drawing Sheets

STRUCTURE AND PROCESS FOR A GOUGE-FREE STACKED NON-VOLATILE MEMORY CELL WITH SELECT GATE

RELATED APPLICATION

This is a Divisional of co-pending application Ser. No. 08/537,131, filed Sep. 29, 1995.

BACKGROUND OF THE INVENTION

1. Field of the Invention

The present invention relates to semiconductor memory devices and more particularly to a structure and method of producing a non-volatile memory cell with select gate.

2. Background of the Invention

A metal oxide semiconductor ("MOS") transistor generally includes source/drain regions in a substrate, and a gate electrode formed above the substrate between the source/drain regions. A field effect transistor ("FET") is a transistor in which the resistance of the current path from source to drain is modulated by creating an electric field in the substrate by applying a charge on the gate. A simple example of an FET is a select gate or select transistor that consists generally of a polysilicon gate on top of a gate oxide above a substrate, the polysilicon gate coupled to an electrode.

A type of transistor cell that is an integrated circuit memory cell or charge storer is the erasable programmable read-only memory ("EPROM"). EPROMs frequently use memory cells that have electrically isolated gates (floating gates) such as an enhancement-type n-channel metal-oxide semiconductor field effect transistor (MOSFET) with two gates typically of polysilicon material, otherwise known as a Floating Gate Avalanche Injection Metal Oxide Semiconductor (FAMOS) device. In FAMOS technology, information is stored in the memory cells in the form of charge on the floating gates. The EPROM can be programmed by a user, and once programmed, the EPROM retains its data until erased. This type of storage retention is referred to as non-volatile memory.

The EPROM integrated circuit comprises memory cells logically organized by an array of rows and columns. Typically, the rows represent word lines and the columns represent bit lines. By selecting the appropriate word line and bit line, each individual cell may be programmed or read. During the programming operation, a given memory cell or cells are selected for programming, then voltage is applied to the control gate of each memory device (e.g., a FAMOS device). A programming voltage is applied to the bit line of each selected memory cell. The programming voltage generates a programming current flowing through the selected bit line, thus programming the memory cell or cells. The FAMOS memory cell can be in a programmed state wherein the memory cell is not conducting current, or in a "not programmed" state, wherein the memory cell is conducting current.

EPROMs, like FAMOS devices, depend on the long-term retention of electronic charge as the information-storage mechanism. As noted, the charge is stored on a floating polysilicon gate of a MOS device. The term "floating" refers to the fact that no electrical connection exists to this gate. The floating gate is completely surrounded by an insulator, like silicon dioxide, $SiO_2$. Charge is transferred to the floating gate through the encapsulating layer by the injection of hot electrons. For example, in modern FAMOS technology, the gate, e.g., a control gate insulated from floating gate, and the drain are raised to 12 V while the source and substrate are kept grounded. Hot electrons are created near the drain and these hot electrons are attracted to the floating gate because the floating gate has a more positive potential than the drain. Some of these hot electrons will have enough energy to pass over the insulator oxide and charge the floating gate. Once the hot electrons are transferred to the gate, they are trapped there.

The charge in the floating gate is removed (i.e., the memory is erased) by exposing the EPROM (e.g., a FAMOS transistor) to ultraviolet (UV) light or erasing the EPROM electrically (EEPROM). Exposing the EPROM to UV light permits the simultaneous erasure of all of a memory's array cells that in some applications is desirable. However, EPROMs that require UV light for erasing must be packaged in an expensive ceramic package with a UV-transparent quartz window. In addition, the EPROMs must be removed from the circuit board and put into a special UV eraser to erase the memory.

EEPROMs erase the contents of a ROM electrically. One widely used EEPROM is a floating gate tunneling oxide (FLOTOX) transistor. Programming and erasing of a FLOTOX transistor is done by causing electrons to be transferred from the substrate to the floating gate by a process known as Fowler-Nordheim tunneling, wherein by way of significant voltages (e.g., 12 volts), electrons are transferred from or returned to the substrate by tunneling through a portion of the gate oxide. Because of the high voltages applied to the transistor during erasing, a FLOTOX EEPROM must be isolated by a select transistor. Thus, a FLOTOX EPROM cell consist of two transistors, the memory transistor and a select transistor.

Another type of EEPROM is the flash EEPROM. The flash EEPROM permits the simultaneous erasing of all of the memory's array cells similar to a UV-EPROM. The erasing mechanism of the flash EEPROM can be accomplished in a fashion similar to the FLOTOX by using tunneling off the floating gate to the drain region. Most flash EEPROM configurations incorporate a separate "erase node" into the cell. Such an "erase node" is not art of an FET transistor, but rather just a diffusion area over which the floating gate overlaps. By utilizing an "erase node", the EEPROM device does not need to support the high voltage needed for erasure. Programming of the floating gates of flash EEPROMs is generally accomplished by hot-electron transfer injection into the gate. Selective erasing can also be achieved through the use of the erase node or select gate.

Most FAMOS memory cells that consist of an EEPROM transistor and a select gate use a double-polysilicon FAMOS device with a single polysilicon select gate. The floating layer of polysilicon is isolated by insulating layers between the substrate and the top polysilicon layer. In EPROM technology, the top polysilicon layer is the control gate. The select gate is used to prevent "overerasure" from inhibiting device performance or functionality. After a FAMOS device is erased, the threshold of the device will be reduced. If the device is overerased, excess charge is removed from the gate and the threshold of the device may drop below the intrinsic value, resulting in current conduction even if the control gate voltage is 0 volts. During read operations, this may cause unselected FAMOS devices to allow a current leakage from the bit line that will be misinterpreted by the circuit as an indication that the selected device is conducting or "unprogrammed". Secondly, during the programming, excess leakage from unselected devices may cause a bit line voltage drop that prevents the selected cell from programming. The select gate serves to isolate the FAMOS device from the rest of the array when it is not selected. The isolation avoids the problems discussed. If no select gate is used, complicated and time consuming or iterative erase/program schemes must be used, and new limits are placed on process latitude. For more information on semiconductor memory cells, see S. Wolf and R. N. Tauber, *Silicon Processing for the VLSI Era*, Vol. 2, pp. 619–42 (1990).

Another type of integrated circuit that incorporates nonvolatile memory but is not an EPROM is a Programmable Logic Device ("PLD"). A PLD is a device for which the logical output is a function of the input. The logic function performed by the device is programmable, possibly through the use of embedded FAMOS devices. A PLD can be made reprogrammable by using a flash cell in the device. In practice, the way a PLD differs from a memory device is that the PLD is "sequential", which means that the outputs are a function of the inputs not only at the present clock cycle, but of the value of inputs at previous clock cycles. Also, because many combination of inputs may not be of interest, for a given number of cells, the PLD has many more inputs than a memory cell, e.g., an EPROM.

FIG. 1(g) is a circuit schematic which shows a typical memory cell in a nonvolatile memory array. The cell includes a float gate field effect transistor (FET) 21 and a select gate field effect transistor 20 coupled in series between a bit line 22 and a reference line (Vss) 23, which is typically ground. It will be appreciated that there are other memory cells (having the same configuration) for different row lines (i.e. other than row line 24) which cells are also coupled between line 22 and line 23. The source/drain current paths of both FETs 21 and 20 are coupled in series such that when the floating gate is not charged from programming, it is possible for current to flow between the bit line 22 and reference line 23. The gate electrode 25 of the select gate FET 20 is coupled to receive the conventional gate signal for the insulated gate of the select gate FET 20. The gate electrode 24 of the floating gate FET 21 is coupled to the conventional row-line in the array of memory cells. It will be appreciated that the select gate FET is designated to help programming, particularly for electrically erasable memory cells. In a memory cell architecture which does not use a select gate FET, if a floating gate FET of a memory cell is overerased, there tends to be a strong "pull-down" during programming from the overerased float gate FET (which is not being programmed), and this tends to reduce current through memory cells which are being programmed. Thus, the select gate FET may be used to solve this overerasing problem by turning off the select gate FET for those memory cells which are not being programmed so that certain desired memory cells on the same bit line as those not being programmed can be programmed. Thus, the select gate FET performs an important function during programming. It will be appreciated that during reading (after programming has been completed), the select gate FET is turned on to allow the floating gate to be "sensed".

Figure 1:
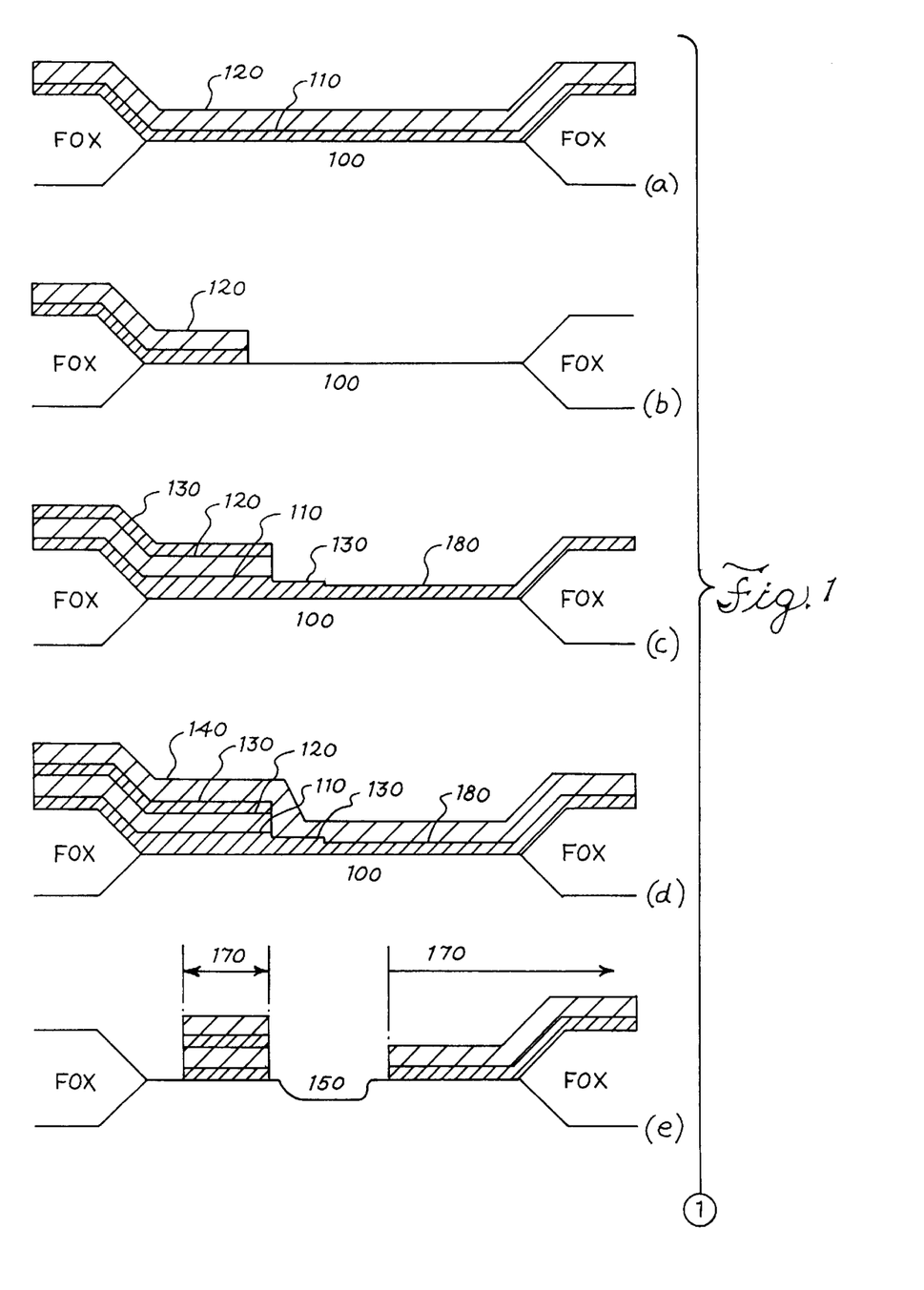
FIG. 1 is a cross-sectional view parallel to current flow of an illustration of a prior art process for preparing a non-volatile memory cell with a FAMOS transistor and a select transistor.

Conventional preparation techniques of nonvolatile memory cells involves oxidation, diffusion, and photolithographic etching processes conventionally used in semiconductor technology. FIG. 1 presents an illustration of the prior art preparation of a memory cell with a select gate. The conventional process involves several steps. First, an insulating layer (e.g., doped or undoped silicon dioxide) is grown on a semiconductor substrate of one polarity 100. Next a first conductive layer 120 is applied and etched on the surface of the substrate between areas where source and drain regions of opposite polarity from the substrate 100 are to be formed, i.e., a FAMOS device region, FIGS. 1(a) and 1(b). A second insulating layer 130 is then grown over the conductive layer of the FAMOS transistor region, FIG. 1(c). Then an insulating layer is grown at a second site on the surface of the substrate between areas where source and drain regions of opposite polarity from the substrate 100 are to be formed, i.e., the select gate region, FIG. 1(c). For example, an silicon dioxide/silicon nitride/silicon dioxide ("ONO") layer is masked and etched over the select gate region, followed by an oxidation to create the gate oxide 180 over the select gate region. Finally, a second conductive layer 140 is applied and etched over the FAMOS transistor region and a first conductive layer 140 over the select gate region, FIGS. 1(d)–(g).

In comparison to the select gate in the process described above, the FAMOS transistor region gets an additional insulating layer and an additional conductive layer. Further, the second conductive layer etch generally consists of two separate etches. First, the conductive regions above the FAMOS transistor site and the select gate region are defined. The conductive regions above the FAMOS transistor region and the select gate region (i.e., the single conductive layer region) are masked 170 (i.e., covered with a photosensitive emulsion or photoresist after development of the photoresist) so that the area adjacent to the FAMOS transistor site is exposed. The exposed area is then etched to remove conductive material from the area adjacent to the FAMOS transistor site, FIG. 1(e). For explanatory purposes, this etch is referred to as the "FAMOS etch". With its additional conductive layer, the FAMOS transistor site is significantly higher or thicker than the single conductive layer on the substrate surrounding the select gate site. To assure that residual conductive material is removed from the substrate, the FAMOS etch of the material adjacent to the FAMOS transistor site must overlap into the region of the select gate transistor site. As illustrated in FIG. 1(e), the different thickness of material (i.e., the double layer FAMOS region versus the single layer select gate region), causes the substrate subjected to the first etch around the select gate region to be undesirably gouged or etched 150.

The next conductive layer etch defines the select gate site, FIG. 1(f). For this etch, the FAMOS region and the select gate site are masked 190. To assure that the select gate is not defined adjacent to the gouge, the mask 190 does not extend into or cover the entire gouged-substrate area. As illustrated in FIG. 1(f), when the unmasked area is etched to define the select gate, the substrate is susceptible to secondary gouging 160 from the select gate etch. The completed cell thus consists of a FAMOS transistor with stacked conductive layers separated by an insulating layer and a select gate transistor that is a single conductive layer, FIG. 1(f). The substrate on which the transistors rest are gouged at an area adjacent to the FAMOS device and the select gate.

M. Momodomi, et al., "New Device Technologies for 5V-Only $ Mb EEPROM with NAND Structure Cell", *IEDM Tech. Dig.*, pp. 412–15, 1988 ("Momodomi"), describes an EEPROM memory cell with select gate. The memory cell uses Fowler-Nordheim tunneling for programming and erasing (i.e., FLOTOX). Momodomi describes a cell made up of eight memory transistors and two select transistors. The memory transistors are FAMOS transistors. The select transistors are comprised of two stacked conducting layers separated by an insulating layer. The select transistor described in Momodomi consists of a floating conducting layer similar to the floating conducting layer of a FAMOS device. Momodomi does not specifically describe the fabrication of the memory cell.

The gouge in the substrate produced by the prior art process has several negative effects. First, the gouge increases the resistance along the read and programming paths which reduces the read current, decreases the programmed voltage, and may increase program time. Secondly, the gouge potentially creates crystalline defects such as dislocations, associated with stress at the sharp corners of the gouge or the roughened substrate surface. These defects can lead to leakage to the substrate or across one of the transistors which can cause functional failure. The gouge also causes severe topology. A significant step height exists between the top of the FAMOS stack to the bottom of the gouge. Later in the process, the topology is hard to fill with a void-free insulator and the non-planar surface makes patterning subsequent layers difficult. Further, oxide spacers will be formed at the interior of the gouge edges. Obtaining an electrical connection beneath these spacers establishes a minimum thermal cycle for the process that may prevent optimization. Finally, the transistors must be spaced away from the gouge, because a transistor spaced close to the gouge will experience degraded performance. The amount of spacing must accommodate the possibility of misalignment between masking layers and is, therefore, larger than the theoretical minimum. The spacing requirements will increase the size of the cell. In addition to the gouge, an oxide spacer may be created at the FAMOS-etch mask edge in the select gate region, see FIG. 1(e). During the subsequent select gate etch, the oxide spacer will not be removed. The oxide spacer may mask a residual poly stringer. The presence of the residual poly stringer limits layout options by preventing the intersection of the FAMOS-etch mask (photoresist layer 170) and the select gate mask (photoresist layer 190). The oxide spacer will also contribute to the resistance of the read/programming path in the cell.

To overcome the problems described, there is a need for a non-volatile memory cell with a FAMOS transistor and a select transistor and a process for making the described cell whereby the cell substrate is not gouged as a result of a series of etching steps.

SUMMARY OF THE INVENTION

The invention relates to a structure and process for a gouge-free substrate, non-volatile memory cell with a FAMOS transistor and a select gate transistor. The gouge-free substrate non-volatile memory cell is useful in all types of programmable memory circuits, including EPROMS, EEPROMS, flash EEPROMS, and PLDs. The gouge-free substrate cell includes a FAMOS transistor and a select gate transistor wherein the select gate transistor comprises first and second conductive layers wherein the second conductive layer covers or encompasses the first conductive layer and wherein electrical contact is made to the first conductive layer. The invention contemplates that the first and second conductive layers can be separated, at least partially, by an insulative layer. The invention further contemplates that the first and second conductive layers may be of different cross-sectional areas, wherein the cross-sectional area of the first conductive layer is larger than the cross-sectional area of the second conductive layer and wherein electrical contact is made to the first conductive layer at a sight not covered by the second conductive layer.

The invention also relates to a process for producing a gouge-free substrate cell with a FAMOS transistor and a select gate transistor. The process utilizes conventional oxidation, diffusion and photolithographic etching techniques. The process involves growing a first insulating layer on a semiconductor substrate; the first insulating layer may be masked and etched, followed by the growth of an insulator. The two growth processes result in a single insulator layer for which the insulator thickness varies from region to region. Next, a first conductive layer is applied over the first insulating layer. A second insulating layer is then applied. The second insulating layer is masked to protect the entirety of the first conductive layer of the first insulation site and the second insulating layer is etched. A second conductive layer is applied. This is followed by masking and etching of the stack composed of the second conductive layer, second insulating layer in some regions, first conductive layer, and first insulating layer. The select gate transistor formed consists of two conductive layers with or without an insulating layer between the conductive layer. The select gate transistor may also have an insulating layer that does not extend completely between the two conductive layers; for instance, when the insulating etching mask does not completely enclose the select gate. The important point is that electrical contact is made to the first conductive layer. Thus, the second conductive layer may be electrically connected by virtue of its direct contact with the first conductive layer or "floating" by virtue of being isolated by an insulating layer from the first conductive layer.

The invention also relates to a method for producing die circuits peripheral to the non-volatile memory cell. The gates of peripheral circuits are constructed, similar to the select gate of the non-volatile memory cell described above, of two conductive layers with or without an insulating layer between the conductive layer. In this embodiment, electrical contact is again made to the first conductive layer and the second conductive layer is either electrically connected by virtue of its direct contact with the first conductive layer or "floating" by virtue of being isolated by an insulating layer from the first conductive layer. Alternatively, the gates of peripheral circuits are constructed of second layer conductive material in a process involving the etching or removal of the first conductive material layer prior to the deposition of the second conductive material layer.

BRIEF DESCRIPTION OF THE DRAWINGS

The features, aspects, and advantages of the present invention will become more thoroughly apparent from the following detailed description, appended claims, and accompanying drawings in which:

FIGS. 1(a)–1(f) illustrate the sequential steps in the process.

FIG. 1(g) shows a circuit diagram for a typical cell in a non-volatile memory array.

FIGS. 2(a)–2(g) illustrate the sequential steps in the process.

FIGS. 3 through 6 illustrate an alternative process of the invention wherein a gouge-free substrate, non-volatile memory cell with a FAMOS transistor and a select transistor with two layers of conducting material is formed wherein the second conductive layer of the select transistor is floating.

FIGS. 3(a)–3(e) illustrate the sequential steps in the process to the point of defining a FAMOS device and a select gate.

FIGS. 5(a)–5(c) illustrate the sequential steps in the process whereby electrical contact is made to the first conductive layer of the select gate.

FIGS. 8(a)–8(f) illustrate the sequential steps in the process.

FIGS. 9(a)–(g) illustrate the sequential steps of one embodiment of the alternative process, while FIGS. 9(a)–9(b), and 9(h)–9(l) illustrate the sequential steps of a second embodiment of the alternative process.

DETAILED DESCRIPTION OF THE INVENTION

The invention relates to a structure and process for a gouge-free substrate, non-volatile memory cell with a FAMOS transistor and a select transistor. More particularly, the gouge-free substrate cell includes a FAMOS transistor and a select transistor wherein the select transistor comprises first and second conductive layers wherein electrical contact is made to the first conductive layer. In the following description, numerous specific details are set forth such as specific materials, thicknesses, processing steps, process parameters, etc., in order to provide a thorough understanding of the invention It will be obvious to one skilled in the art, however, that these specific details need not be employed to practice the invention. In other instances, well known materials or methods have not been described in detail in order to avoid unnecessarily obscuring the invention. Furthermore, in the following discussion, several embodiments of the invention are illustrated with respect to specific structures, oxide layers, and oxide layer openings. It will be appreciated that each of the methods described herein can be utilized on a variety of structures and oxide layers, to form any type of opening, and each of the insulating layer etching methods described herein is not necessarily restricted to the structure and/or insulating layer in conjunction with which it is described. Further, any of the methods described herein may be performed as part of a multistep etch comprising additional etch processes.

Figure 2:
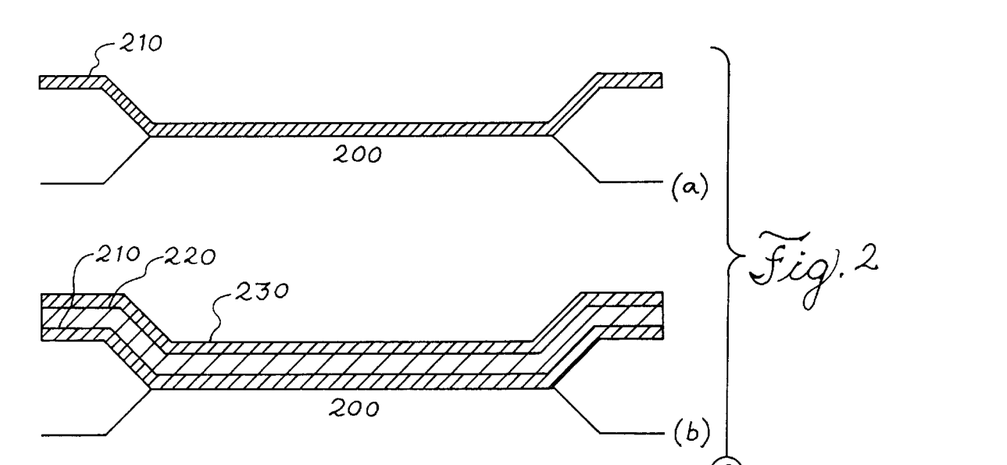
FIG. 2 is a cross-sectional view parallel to current flow of an illustration of a process of the invention wherein a gouge-free substrate, non-volatile memory cell with a FAMOS transistor and a select transistor with two layers of conducting material is formed.

FIG. 2 illustrates a cross-sectional view of an embodiment of the process of the invention. To a substrate surface cell (i.e., a defined transistor area) 200 of one polarity, and where source and drain regions of opposite polarity from the substrate are to be formed for both a FAMOS transistor and a select transistor, is added an insulating layer 210 such as doped or undoped silicon dioxide. (FIG. 2(a)) The insulating layer 210 may be grown by a conventional oxidation process, or may be deposited by physical deposition (e.g., sputtering) or added by a variety of chemical deposition methods and chemistries (e.g., chemical vapor deposition ("CVD")). It should be appreciated by a person of ordinary skill in the art that the insulating layer 210 need not be of a single thickness, but may actually be multiple thicknesses. For example, the insulating layer of a FAMOS transistor and that of a select transistor may have different thicknesses. This would be achieved by growing an oxide on a region, masking and etching the oxide with a wet etch (e.g., diluted HF or buffered oxide etch), stripping the resist, and growing a second oxide over the same region. The process could be repeated for a third oxide thickness. The region exposed to multiple oxide growths would be thicker than a region exposed to a single growth. A flash cell, for example, contains a tunnel oxide and a gate oxide (i.e., a first insulating layer) wherein the tunnel oxide is thinner (80–100 angstroms) than the gate oxide (165 angstroms) but wherein both the tunnel oxide and the gate oxide must be between the first polysilicon layer and the substrate.

To the insulating layer 210 described above is deposited by low pressure CVD ("LPCVD") an N-type first conducting layer 220 of polysilicon doped by implantation with phosphorous to a resistivity of 50–200 ohms/square. The polysilicon layer 220 is deposited using an LPCVD tube and $SiH_4$ gas at 200–400 mtorr with a thickness of 2000–3000 angstroms. It should be appreciated by those skilled in the art that this conducting layer 220 could instead be a metallic conductor of, for example, W, Mo, Ta, and/or Ti, or that this conducting layer 220 could also be a silicide, consisting of $Wsi_2$, $MoSi_2$, $TaSi_2$, PtSi, PdSi, or that this conducting layer 220 can further be a layered structure consisting of a silicide on top of doped polysilicon.

The deposition of the polysilicon layer 220 is followed by a silicon dioxide/silicon nitride/silicon dioxide ("ONO") layer 230 with a total thickness of 150 angstroms. It should be appreciated by those of ordinary skill in the art that this ONO layer 230 could instead be an insulating layer of, for example, silicon dioxide, $SiO_2$, tetraethyl orthosilicate ("TEOS"), silicon nitride ($Si_xN_y$), or silicon oxynitride ($SiO_xN_y(H_z)$). (FIG. 2(b)) Additionally, the insulating layer 230 may be undoped or may be doped, for example with boron, phosphorous, or both, to form, for example, borophosphosilicate glass ("BPSG"), phosphosilicated glass ("PSG"), and borophosphosilicate tetraethyl orthosilicate ("BPTEOS"). The second insulating layer 230 need not extend across the length of the cell, but must cover the region to be occupied by the FAMOS transistor.

Next, a conventional photolithographic etching process is performed whereby a layer of photoresist 240 is applied to the cell region above the FAMOS transistor region and the cell is etched, using a parallel plate plasma etcher with a power of 200–300 watts, to remove insulating material from the select transistor region. (FIG. 2(c)) The etching material utilized should have sufficient selectivity to remove the insulating material without subsequently removing the conducting material beneath the insulating material layer. The purpose of the etch is to remove ONO material from the select transistor region to allow direct electrical contact of a subsequent conducting material to the first conducting layer, i.e., the first polysilicon layer, of the select transistor. This insulating layer etch need not remove the insulating material from the entirety of the select transistor region, rather it is enough if the ONO is removed so as to expose a portion of the first conducting layer 220, i.e., the first polysilicon layer, in the select transistor region. Further, if any transistors in the periphery are to be constructed from subsequent second level conducting material rather than the first conducting layer, i.e., the first polysilicon layer, as contemplated by the invention, the ONO etch will simultaneously remove the ONO from the periphery active areas, and a subsequent oxidation to form a gate oxide may be done prior to the deposition of the second conducting layer.

As shown in FIG. 2(d), a second N-type conducting layer 250 of polysilicon, doped by implantation with phosphorous to a resistivity of 50 ohms/square, is deposited across the cell by LPCVD. Similar to the first conducting layer 220, the second polysilicon layer 250 is deposited using an LPCVD tube and $SiH_4$ gas at 200–400 mtorr with a thickness of 2000–3000 angstroms. It should be appreciated by those skilled in the art that this conducting layer 250 could instead also be a metallic conductor of, for example, W, Mo, Ta, and/or Ti, or that this conducting layer 250 could also be a silicide, consisting of $WSi_2$, $MoSi_2$, $TaSi_2$, PtSi, PdSi, or that this conducting layer 250 can further be a layered structure consisting of a silicide on top of doped polysilicon.

The depositions described above are followed by a series of photolithographic etching processes to define conducting and insulating layers above the FAMOS transistor region and the select transistor region. The etches are performed using a parallel plate plasma etcher with a power of 200–300 watts.

First, with reference to FIG. 2(e), areas above a FAMOS transistor region and a select transistor region are covered and protected from etching material by a photoresist material 260. Next, a single polysilicon photolithographic etch is carried out using a chlorine plasma etch ($Cl_2$/He) to define the second polysilicon conducting layer 250 above the FAMOS transistor region and the select transistor region. This is followed by a fluorocarbon etch, $C_2F_6$/He at 900 mtorr, to remove the insulating material from areas adjacent to the FAMOS transistor region, as illustrated in FIG. 2(f). Next, a polysilicon photolithographic etch is repeated using a chlorine plasma ($Cl_2$/He) to define the first polysilicon conducting layer 220 above the FAMOS transistor region and the select transistor region, as illustrated in FIG. 2(g). A subsequent etch of the first insulating layer 210 to access the source and drain regions of the active area of the transistors is unnecessary since this layer is generally thin, approximately 165 angstroms, and implants can be made through the thin oxide, and the subsequent contact etch is an oxide etch that will easily etch this oxide. If an additional etch is needed to access the source and drain regions of the substrate, a person of ordinary skill in the art should recognize that such an etch is conventional and within the scope of the invention.

Next, the source and drain regions for the FAMOS device and the select gate are separately masked and implanted with suitable dopant utilizing conventional techniques. Approximately 10,000 angstroms of BPSG is deposited over the entire area and then the contact windows are opened by a conventional etching process, the photoresist is removed, and the FAMOS transistor and select transistor are linked to contacts 270, 280 utilizing conventional metallization techniques. More specifically, electrical contact 280 is made to the first polysilicon layer 220 of the select transistor and electrical contact 280 is made to the second polysilicon layer 250 of the FAMOS transistor.

The process described above has been described in terms of multiple etching steps involving multiple passes through the etch chamber. It should be recognized by one of ordinary skill in the art that the etching steps can be combined into a multiple-step etch whereby the etch may be accomplished with one pass through the etch chamber, the etcher changing chemistries and executing the multiple etches sequentially.

The process described above produces the claimed structure of a gouge-free substrate for a non-volatile memory cell that includes a FAMOS transistor and a select transistor. The substrate cell described by the above process yields a FAMOS transistor with a select transistor wherein the select transistor is comprised of two polysilicon layers that are not completely separated by an insulating layer. In other words, the two polysilicon layers are shorted together. Further, the first polysilicon layer 250 is not isolated or "floating". The process yields a gouge-free substrate, because the FAMOS transistor and the select transistor both consist of two conducting material layers. The two, stacked conducting layers of the FAMOS transistor and the select transistor in the cell translates into parallel etching processes that do not expose the cell substrate to gouging. The gouge-free substrate means improved electrical conduction through the substrate and permits spacing between the non-volatile device and the select gate to be at the lithographic minimum.

Figure 3:
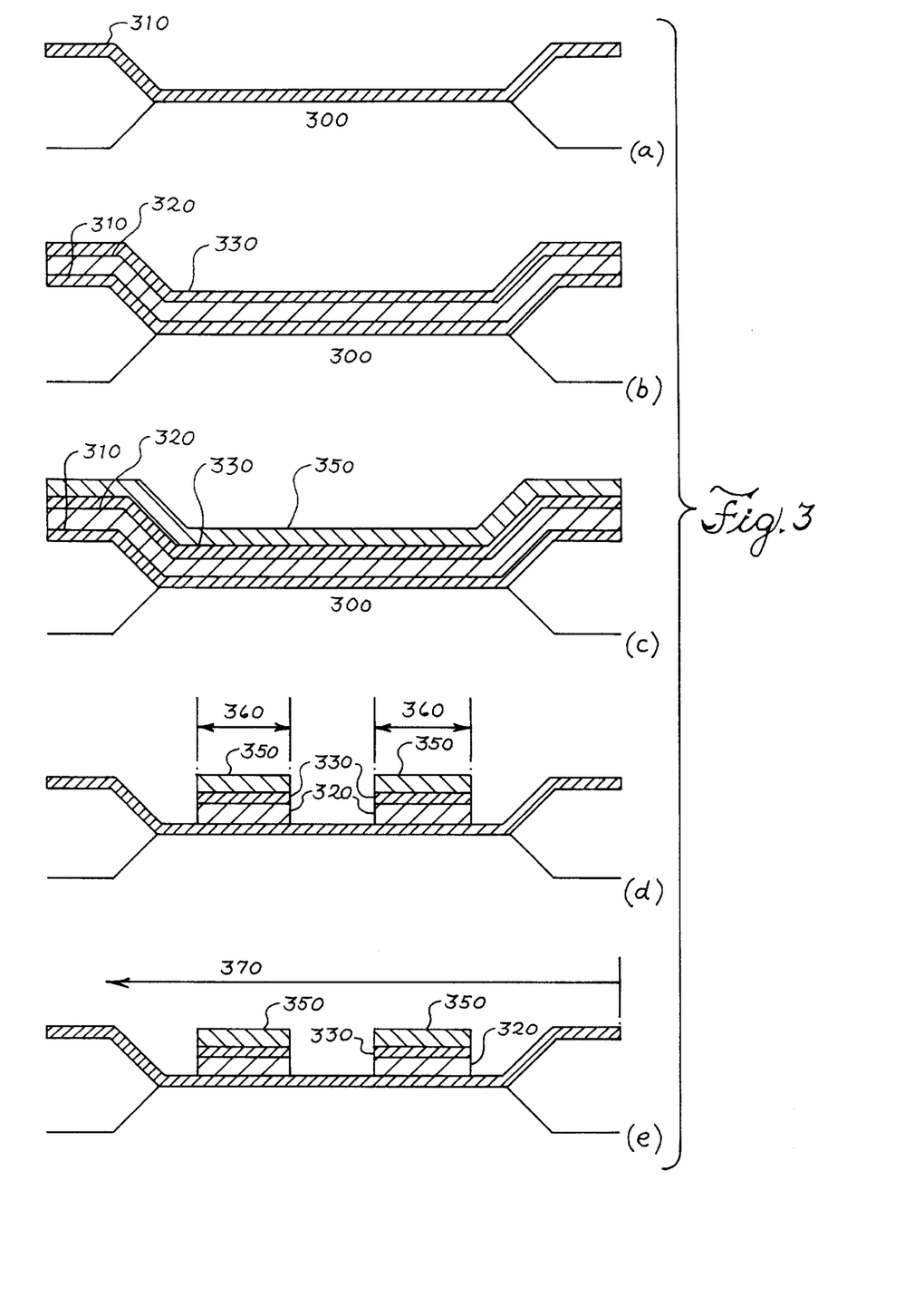
FIG. 3 is a cross-sectional view parallel to current flow of an illustration of an alternative process of the invention wherein a gouge-free substrate, non-volatile memory cell with a FAMOS transistor and a select transistor with two layers of conducting material is formed wherein the second conductive layer of the select transistor is floating.

FIGS. 3 through 6 present different views of an alternative process embodiment for producing a gouge-free, non-volatile memory cell with a FAMOS transistor and a select transistor. FIG. 3 presents a cross-sectional view of the alternative process embodiment parallel to current flow. To a substrate surface cell (i.e., a defined transistor area) 300 of one polarity, and where source and drain regions of opposite polarity from the substrate are to be formed for both a FAMOS transistor and a select transistor, is added by growth or deposition an insulating layer 310 such as doped or undoped silicon dioxide. (FIG. 3(a)) It should be appreciated by a person of ordinary skill in the art that the insulating layer 310 need not be of a single thickness, but may actually be multiple thicknesses, i.e., different thickness for the FAMOS device and the select gate.

To the insulating layer 310 is deposited by LPCVD an N-type first conducing layer 320 of polysilicon doped by implantation with phosphorous to a resistivity of 50–200 ohms/square. The polysilicon layer 320 has a thickness of 2000–3000 angstroms and is deposited using an LPCVD tube and $SiH_4$ gas at 200–400 mtorr. It should be appreciated by those skilled in the art that this conducting layer 320 could instead also be a metallic conductor of, for example, W, Mo, Ta, and/or Ti, or that this conducting layer 320 could also be a silicide, consisting of $WSi_2$, $MoSi_2$, $TaSi_2$, PtSi, PdSi, or that this conducting layer 320 can further be a layered structure consisting of a silicide on top of doped polysilicon.

As illustrated in FIG. 3(b), the deposition of the conducting layer 320 is followed by a second insulating layer 330 of, for example, ONO that completely covers the FAMOS transistor region and the select transistor region, and, in the case of an ONO layer, is approximately 150 angstroms thick. It should be appreciated by those of ordinary skill in the art that this ONO layer 330 could instead be an insulating layer of, for example, silicon dioxide, $SiO_2$, TEOS, silicon nitride, or silicon oxynitride. Additionally, the insulating layer 330 may be undoped or may be doped, for example with boron, phosphorous, or both, to form, for example, BPSG, PSG, and BPTEOS.

A conventional photolithographic etching process can be performed at this point whereby a layer of photoresist is applied to the cell region above the FAMOS transistor region and the cell is etched to remove insulating material from areas adjacent to the FAMOS transistor region and from the select transistor region. Again, this insulating layer etch is entirely optional for this process embodiment and, if it is done, then the etch need not remove the insulating material from the entirety of the select transistor region. This etching step would be included if any transistors in the periphery are to be constructed from subsequent second level conducting material rather than the first conducting layer, i.e., the first polysilicon layer, as contemplated by the invention. A second N-type conducting layer 350 of polysilicon, doped by implantation with phosphorous, is deposited across the cell by LPCVD. (FIG. 3(c)) Similar to the first conducting layer 320, the second polysilicon layer 350 has a thickness of 2000–3000 angstroms and is deposited using an LPCVD tube and $SiH_4$ gas at 200–400 mtorr.

The depositions described above are followed by a series of photolithographic etching processes to define conducting and insulating layers above the FAMOS transistor region and the select transistor region. Referring to FIG. 3(d), the etches are performed using a parallel plate plasma etcher with a power of 200–300 watts. First, areas above a FAMOS transistor region and an area above the cross-sectional area of the select transistor region that contains the second insulating layer 330 are covered and protected from etching material by a photoresist material 360. Next, a single polysilicon photolithographic etch is carried out using a chlorine plasma ($Cl_2$/He) to define the second polysilicon conducting layer 350 above the FAMOS transistor region and above the cross-sectional area of the select transistor region that includes the insulating layer 330. With the same area masked, the polysilicon etch is followed by a fluorocarbon etch, $C_2F_6$/He at 900 mtorr, to remove the insulating material from areas adjacent to the FAMOS transistor region and the select transistor region followed by a second polysilicon etch using a chlorine plasma etch ($Cl_2$/He) to define a polysilcon/ONO/polysilicon stack for the FAMOS device and the select transistor. No additional etch is required to remove the first insulating layer, since the first insulating layer is generally thin and can be implanted through. The subsequent contact etch is an oxide etch and can etch through the thin insulator layer readily.

Figure 4:
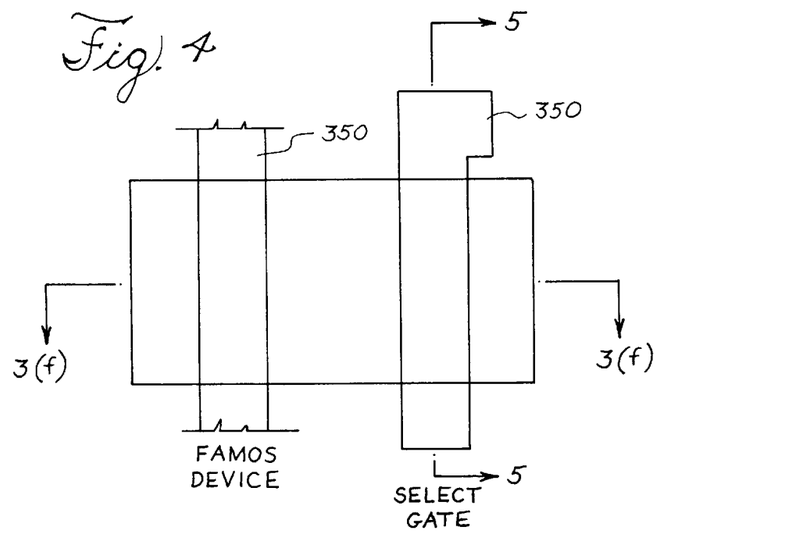
FIG. 4 is a plan view of the alternative process of the invention wherein a gouge-free substrate, non-volatile memory cell with a FAMOS transistor and a select transistor with two layers of conducting material is formed wherein the second conductive layer of the select transistor is floating.

FIG. 4 is a plan view of the cell depicted in FIG. 3(e). FIG. 4 illustrates the FAMOS device adjacent to the select gate. From this plan view, all that is visible of the individual transistors is the second conducting layer 350.

Figure 5:
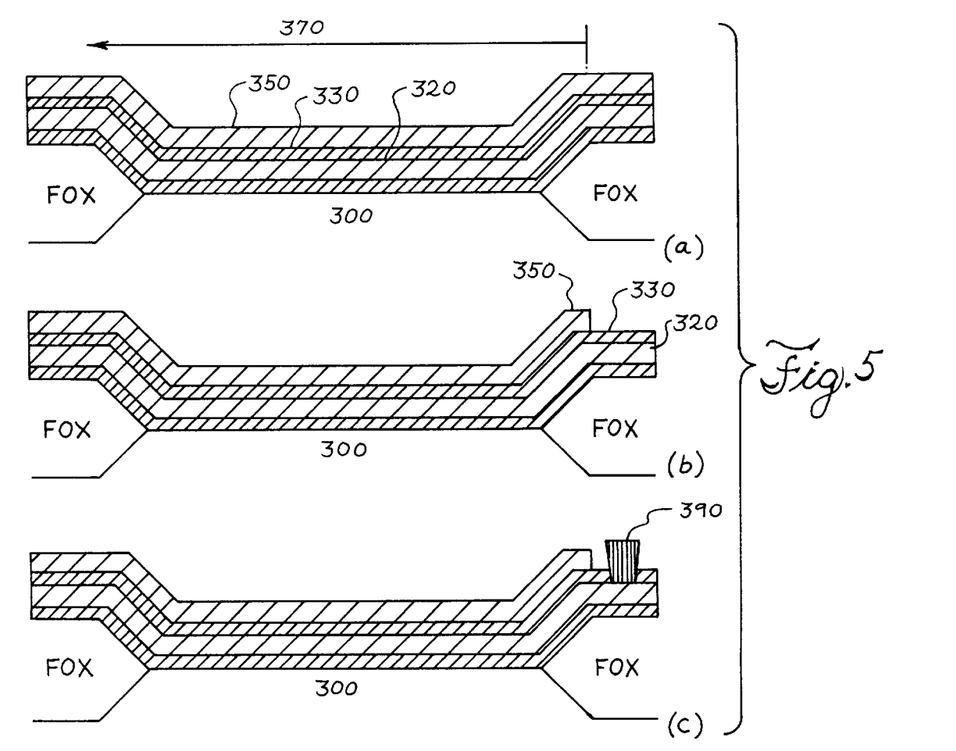
FIG. 5 is a cross-sectional view perpendicular to current flow and taken through line 5 of FIG. 4 of the alternative process of the invention wherein a gouge-free substrate, non-volatile memory cell with a FAMOS transistor and a select transistor with two layers of conducting material is formed wherein the second conductive layer of the select transistor is floating.

FIG. 5 illustrates a cross-sectional view of the same cell taken through line 5 of FIG. 4. FIG. 5 is a cross-sectional view of the select gate perpendicular to current flow. FIG. 5(a) shows a second conducing layer 350 over a first insulating layer 330 that is covering a first conducting layer 320. A photolithographic masking step, with mask 370, is used to expose a window over a portion of the select gate, while the FAMOS device and the portion of the select gate over active area (i.e., area between source and drain regions) will be protected. (FIG. 5(b)) The window will generally be over a field oxide region over which the select gate stack extends in the direction perpendicular to current flow. A $Cl_2$/He etch is used to remove the polysilicon from this window. The source and drain regions for the FAMOS device and the select gate are subsequently separately masked and implanted with suitable dopant utilizing conventional techniques. For example, the source and drain regions for the FAMOS device are implanted with arsenic to 40 ohms/square, while the source and drain regions for the select gate are implanted with phosphorous to 60 ohms/square. This is followed by a contact etch ($C_2H_6$/$CHF_3$ at 400 mtorr.) to make contact to the first polysilicon conducting layer 320. Next, any photoresist is removed, and the FAMOS transistor and select transistor are linked to contacts utilizing conventional metallization techniques. FIG. 5(c) illustrates the select gate linked to a contact 390.

Figure 6:
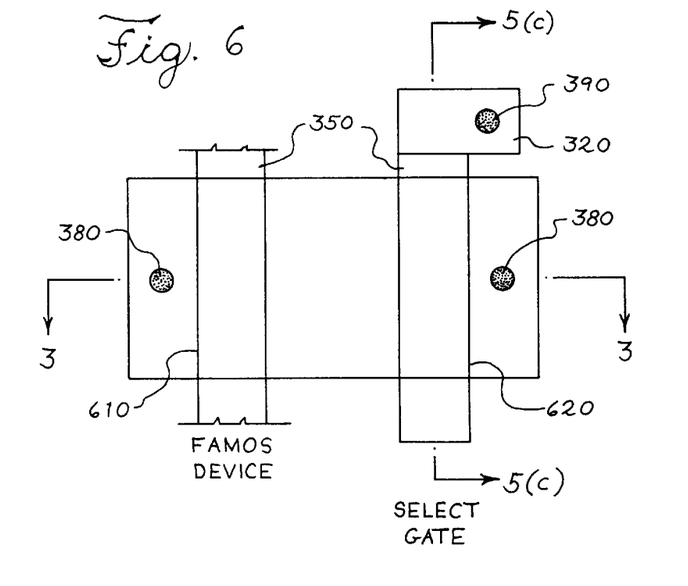
FIG. 6 is a plan view of the completed structure produced by the alternative process of the invention wherein a gouge-free substrate, non-volatile memory cell with a FAMOS transistor and a select transistor with two layers of conducting material is formed wherein the second conductive layer of the select transistor is floating.

FIG. 6 is a plan view of the completed cell process described above. FIG. 6 presents a FAMOS device 610 adjacent to a select gate 620. FIG. 6 shows the window over a portion of the select gate 620 whereby the first conducting layer 320 is exposed and contact 390 at this point is established. FIG. 6 also shows electrical contacts 380 made to the drain regions of the FAMOS device 610 and the select gate 620.

The result of the described process is a first conducting layer 320 of the select transistor with a larger cross-sectional area than the cross-sectional area of the second conducting layer 350. Because the cross-sectional area of the first conducting layer 320 of the select transistor is larger than the cross-sectional area of the second conducting layer 350 of the select transistor, and because electrical contact is made between the contact and the first conducting layer 320, it is contemplated that the second conducting layer 350 may be completely isolated or "floating" with regard to charge to the select transistor region.

Figure 7:
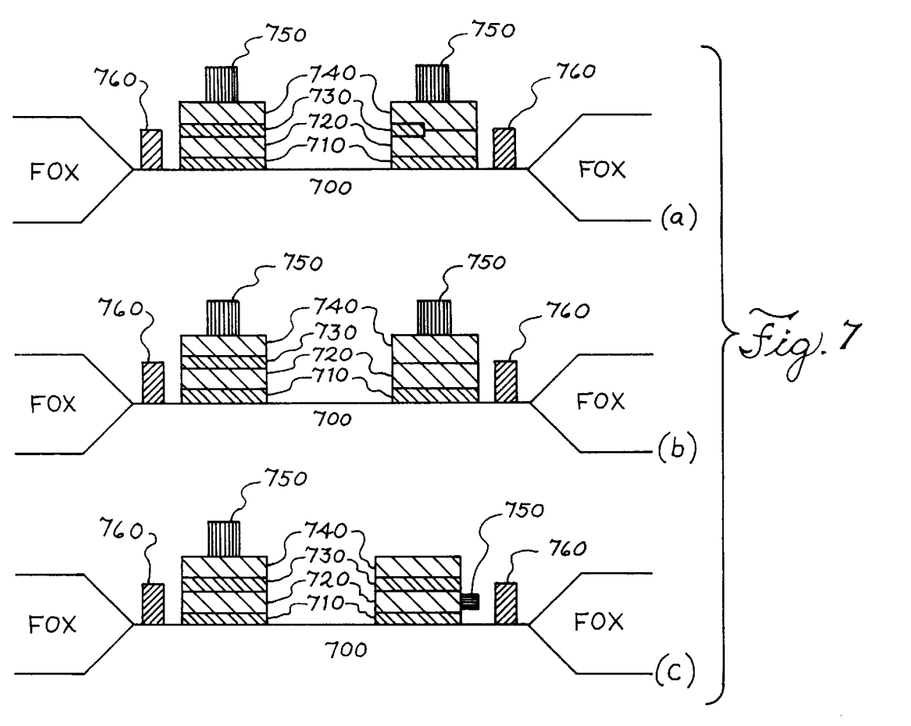
FIG. 7 is a cross-sectional view parallel to current flow of an illustration of three embodiments of the structure, FIGS. 7(a)–7(c), of the invention comprising a gouge-free substrate, non-volatile memory cell with a FAMOS transistor and a select transistor with two layers of conducting material.

FIG. 7 presents a series of embodiments of a structure for a gouge-free non-volatile, substrate cell including a FAMOS transistor and a select transistor. FIG. 7(a) illustrates a non-volatile cell with a FAMOS transistor and a select transistor wherein the select transistor is comprised of an insulating layer or gate oxide 710, a first conducting layer 720, a second insulating layer 730 wherein the second insulating layer 730 does not encompass the entire cross-sectional area of the select transistor region, and a second conducting layer 740. Electrical contact is made between the contact 750 and the first conducting layer 720 and between the contact 760 and the drain region. In FIG. 7(a), electrical connection is made between the first conducting layer 720 and the second conducting layer 740 of the select transistor.

In FIG. 7(b), the select transistor is comprised of an insulating layer or gate oxide 710, a first conducting layer 720, and a second conducting layer 740. Electrical contact is made between the contact 750 and the first conducting layer 720 and between the contact 760 and the drain region. In FIG. 7(b), electrical connection is made between the first conducting layer 720 and the second conducting layer 740 of the select transistor.

The select transistor in FIG. 7(c) is comprised of an insulating layer or gate oxide 710 , a first conducting layer 720, a second insulating layer 730 wherein the second insulating layer 730 may or may not encompass the entire cross-sectional area of the select transistor region, and a second conducting layer 740. In this embodiment, the second conducting layer 740 may or may not be completely isolated from the first conducting layer 720 by the second insulating layer 730. Electrical contact is made between the contact 750 and the first conducting layer 720 and between the contact 760 and the drain region. A structure similar to this would be produced by the process described above with reference to FIGS. 3–6. For illustration purposes, FIG. 7(c) shows the contact 750 shown extending horizontally from the first conductive layer 720 in the cross-sectional view depicted. As illustrated by FIG. 7(c), there is no electrical connection made between the first conducting layer 720 and the second conducting layer 740 of the select transistor. In other words, the second conducting layer is "floating".

The preceding discussion focused on the construction of circuits that are non-volatile cells. The invention contemplates that the periphery of a die containing circuits that are not non-volatile cells can be constructed using similar technology. Examples of circuits in the periphery of a die include CMOS gate circuits like NOR, NAND and transmission gates. Gouging is not a problem in the periphery, because the FAMOS transistors, with their stacked polysilicon structures, are not in close proximity to periphery transistors. Further, a unique periphery etch is used and the overlaps between the masks could be over field oxide which is not subject to gouging.

A process of peripheral circuit construction contemplated by this invention is constructing the peripheral circuit exactly as, and in or not in conjunction with, the select gate construction discussed above, i.e., by either of the processes discussed with references to FIGS. 2 and 3–6, or as any of the structures discussed with reference to FIG. 7.

Figure 8:
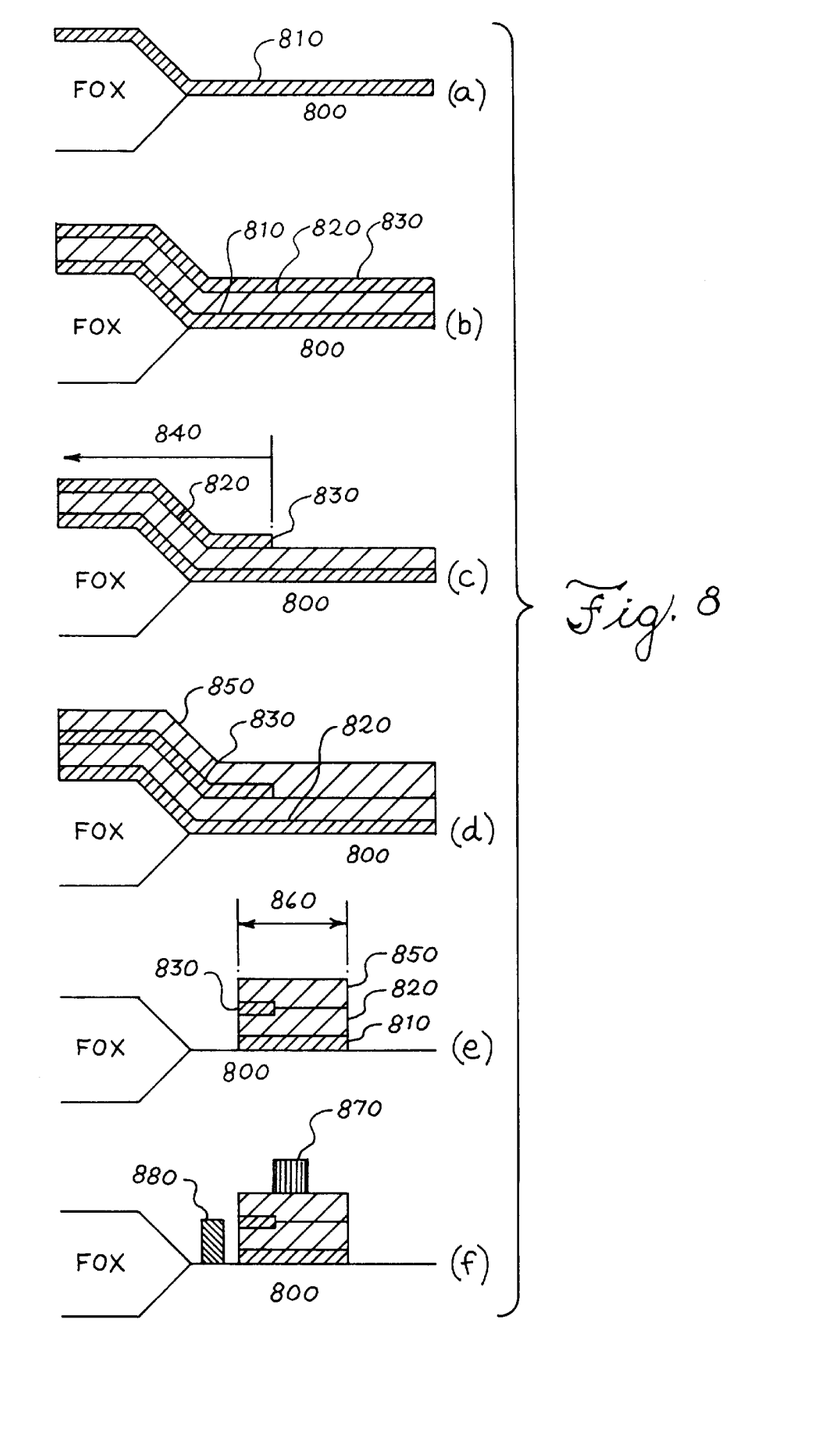
FIG. 8 is a cross-sectional view parallel to current flow of an illustration of a process of the invention for the construction of peripheral circuits of stacked conducting layers.

FIG. 8 illustrates a peripheral circuit constructed from the process discussed above with reference to FIG. 2. First, an insulating layer 810 is grown or deposited on a substrate surface of one polarity where source and drain regions of opposite polarity from the substrate are to be formed for a periphery circuit transistor. (FIG. 8(a)) To the insulating layer 810 is deposited by low pressure CVD an N-type first conducting layer 820 of polysilicon doped by implantation with phosphorous. (FIG. 8(b)) The polysilicon layer 820 is deposited using an LPCVD tube and $SiH_4$ gas at 200–400 mtorr with a thickness of 2000–3000 angstroms. The deposition of the polysilicon layer 820 is followed by the addition of an ONO layer 830. (FIG. 8(b)) Next, a conventional photolithographic etching process is performed with or without a layer of photoresist 840 applied to a portion of the peripheral region, using a parallel plate plasma etcher with a power of 200–300 watts, to remove insulating material from the peripheral transistor region. (FIG. 8(c)) This insulating layer etch need not remove the insulating material from the entirety of the peripheral transistor region, rather it is enough if the ONO is removed so as to expose a portion of the first conducting layer 820, i.e., the first polysilicon layer, in the peripheral transistor region.

As shown in FIG. 8(d), a second N-type first conducting layer 850 of polysilicon, doped by implantation with phosphorous to a resistivity of 50 ohms/square, is deposited across the periphery by LPCVD. Similar to the first conducting layer 820, the second polysilicon layer 850 is deposited using an LPCVD tube and $SiH_4$ gas at 200–400 mtorr with a thickness of 2000–3000 angstroms.

The depositions described above are followed by a series of photolithographic etching processes to define a peripheral transistor comprising a second conducting layer 850 and a first conducting layer 820 and, optionally, an insulating layer 830 partially separating the first and second conducting layers. (FIG. 8(e)) The etches are performed using a parallel plate plasma etcher with a power of 200–300 watts. FIG. 8(f) illustrates the completed peripheral transistor.

Figure 9:
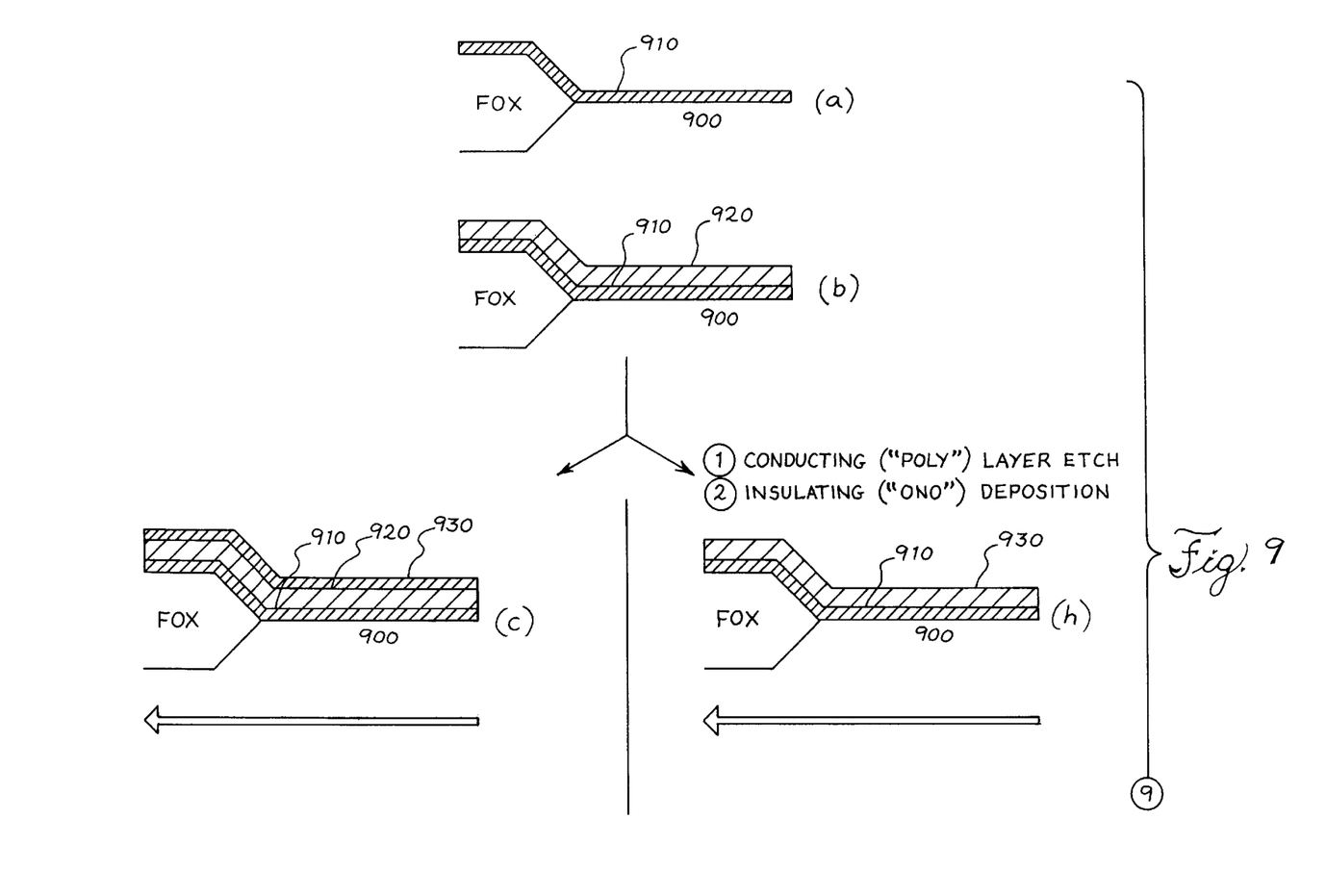
FIG. 9 is a cross-sectional view parallel to current flow of an illustration of an alternative process of the invention for the construction of peripheral circuits of stacked conducting layers.

A second embodiment for a process of construction of periphery circuits contemplated by the invention and illustrated in FIG. 9, constructed alone cr alternatively produced in conjunction with the memory cell construction, entails constructing the peripheral gates of second layer conducting material. The process has many steps similar to the inventive process for construction of a gouge-free substrate, non-volatile memory cell with select gate discussed with reference to FIGS. 2 and 3. According to the peripheral circuit construction process, to a substrate surface of one polarity, where source and drain regions of opposite polarity from the substrate are to be formed for a periphery circuit transistor, is added an insulating layer 910 such as doped or undoped silicon dioxide. (FIG. 9(a) The insulating layer 910 may be grown, or may be deposited by physical deposition (e.g., sputtering) or added by a variety of chemical deposition methods and chemistries (e.g., chemical vapor deposition ("CVD")). It should be appreciated by a person of ordinary skill in the art that the insulating layer 910 need not be of a single thickness, but may actually be of multiple thicknesses. This would be achieved by growing an oxide, masking and etching the oxide with a wet etch (e.g., diluted HF or buffered oxide etch), stripping the resist, and growing a second oxide. The process could be repeated for a third oxide thickness.

To the insulating layer 910 described above is deposited by low pressure CVD ("LPCVD") an N-type first conducting layer 920 of polysilicon doped by implantation with phosphorous. (FIG. 9(b) The polysilicon layer 920 is deposited using an LPCVD tube and $SiH_4$ gas at 200–400 mtorr with a thickness of 2000–3000 angstroms. It again should be appreciated by those skilled in the art that this conducting layer 920 could instead be a metallic conductor of, for example, W, Mo, Ta, and/or Ti, or that this conducting layer 920 could also be a silicide, consisting of $Wsi_2$, $MoSi_2$, $TaSi_2$, PtSi, PdSi, or that this conducting layer 920 can further be a layered structure consisting of a silicide on top of doped polysilicon.

The deposition of the polysilicon layer 920 is followed by the addition of an ONO layer 930. (FIG. 9(c) It should again be appreciated by those of ordinary skill in the art that this ONO layer 930 could instead be an insulating layer of, for example, silicon dioxide, $SiO_2$, tetraethyl orthosilicate ("TEOS"), silicon nitride, $Si_xN_y$, silicon oxynitride, $SiO_xN_y$ ($H_z$), or ONO. Additionally, the insulating layer 930 may be undoped or may be doped, for example with boron, phosphorous, or both, to form, for example, borophosphosilicate glass ("BPSG"), phosphosilicated glass ("PSG"), and borophosphosilicate tetraethyl orthosilicate ("BPTEOS").

Alternatively, the polysilicon layer may be etched (i.e., removed) prior to the deposition of the ONO layer, in which case the etching of the polysilicon and the ONO would not occur sequentially. Such a process is illustrated in FIG. 9(h). In this alternative, a photolithographic etch process, utilizing a $Cl_2$/He etch is performed to remove the polysilicon layer 920. Next, an ONO layer deposition step is performed to deposit an insulating layer 930 above the gate oxide 910.

Next, conventional photolithographic etching processes are performed to etch (i.e., remove) the ONO layer 930, the first layer of polysilicon 920, and the gate oxide 910 (FIG. 9(d), or, alternatively, the ONO layer 930 and the gate oxide 910 (FIG. 9(i). A gate oxide 940 is then grown on the periphery region using conventional oxidation techniques. (FIG. 9(e), 9(j)) The oxidation process is followed by a second polysilicon deposition 950 over the periphery region. (FIG. 9(f), 9(k) Any periphery transistors would then be defined with a periphery-only photolithographic mask 960 and etch. In this scheme, the periphery transistors would be constructed with second-layer polysilicon 950 gates.

In the preceding detailed description, the invention is described with reference to specific exemplary embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method, comprising:

forming a first conductive layer over a gate insulating layer disposed over a semiconductor substrate having first and second active region areas;

forming a second insulating layer over the first conductive layer, subsequently masking a portion of the area of the first active region and then etching unmasked areas of the second insulating layer but not etching the first conductive layer;

applying a second conductive layer and subsequently masking and etching portions of the second conductive layer, the second insulating layer and the first conductive layer in the first and second active region areas; and providing electrical contact to the first conductive layer of the second active region.

2. The method of claim 1, wherein a mask for said second insulating layer extends over the entire area of said first active region.

3. The method of claim 1, wherein said semiconductor substrate comprises an EPROM.

4. The method of claim 1, wherein said semiconductor substrate comprises an EEPROM.

5. The method of claim 1, wherein said semiconductor substrate comprises a Programmable Logic Device.

6. A method, comprising:

forming a first conductive layer over a gate insulating layer disposed over a semiconductor substrate having first and second active region areas;

forming a second insulating layer over the first conductive layer, subsequently masking the area of the first active region and a portion of the area of the second active region and then etching unmasked areas of the second insulating layer but not etching the first conductive layer;

forming a second conductive layer and subsequently masking and etching first portions of the second conductive layer, the second insulating layer and the first conductive layer in the first and second active region areas;

masking and etching second portions of the second conductive layer over the first active region, and providing electrical contact to the first conductive layer of the second active region.

7. The method of claim 6, wherein said area of said second active region includes an adjacent field oxide and at least part of the second portions of the second conductive layer are over said field oxide and said electrical contact is made to said first conductive layer over said field oxide.

8. The method of claim 7, wherein said semiconductor substrate comprises an integrated circuit comprising an EPROM.

9. The method of claim 7, wherein said semiconductor substrate comprises an integrated circuit comprising an EEPROM.

10. The method of claim 7, wherein said semiconductor substrate comprises an integrated circuit comprising a Programmable Logic Device.

11. A method for producing a semiconductor transistor, comprising:

applying a first conductive layer over a gate insulating layer disposed over a semiconductor substrate having an active region area;

applying a second insulating layer over the first conductive layer, subsequently masking a portion of the area of the active region and then etching unmasked areas of the second insulating layer but not etching the first conductive layer;

applying a second conductive layer and subsequently masking and etching portions of the second conductive layer, the second insulating layer and the first conductive layer in the active region area; and providing electrical contact to the first conductive layer of the active region.

12. The method of claim 1, wherein said semiconductor transistor is peripheral to a non-volatile memory cell comprising a floating gate, field effect transistor and a select gate transistor having a first conductive layer and a second conductive layer thereover, wherein electrical contact is made to the first conductive layer of said select transistor.

* * * * *

UNITED STATES PATENT AND TRADEMARK OFFICE
CERTIFICATE OF CORRECTION

| | | |
|---|---|---|
| PATENT NO. | : 6,162,682 | Page 1 of 1 |
| APPLICATION NO. | : 09/010893 | |
| DATED | : December 19, 2000 | |
| INVENTOR(S) | : John Stuart Kleine | |

It is certified that error appears in the above-identified patent and that said Letters Patent is hereby corrected as shown below:

In the claims:

Column 16, line 38, please delete "1" and insert --11--.

Signed and Sealed this

Thirtieth Day of January, 2007

JON W. DUDAS
*Director of the United States Patent and Trademark Office*